(12) United States Patent
Mutaguchi (10) Patent No.: US 7,239,564 B2
(45) Date of Patent: Jul. 3, 2007

(54) SEMICONDUCTOR DEVICE FOR RECTIFYING MEMORY DEFECTS

(75) Inventor: Kohei Mutaguchi, Tokyo (JP)

(73) Assignee: Semiconductor Energy Laboratory, Co., Ltd., Kanagawa, Ken (JP)

( * ) Notice: Subject to any disclaimer, the term of this patent is extended or adjusted under 35 U.S.C. 154(b) by 0 days.

(21) Appl. No.: 10/989,550

(22) Filed: Nov. 17, 2004

(65) Prior Publication Data

US 2005/0141264 A1   Jun. 30, 2005

(30) Foreign Application Priority Data

Nov. 19, 2003   (JP) .............. 2003-389987

(51) Int. Cl.
*G11C 29/00*   (2006.01)
*G11C 7/00*   (2006.01)
*G01R 31/28*   (2006.01)

(52) U.S. Cl. ............... 365/200; 365/201; 714/729
(58) Field of Classification Search ........... 365/200, 365/201; 714/729
See application file for complete search history.

(56) References Cited

U.S. PATENT DOCUMENTS

| | | | | |
|---|---|---|---|---|
| 5,402,377 A | * | 3/1995 | Ohhata et al. ........... | 365/200 |
| 5,452,251 A | * | 9/1995 | Akaogi et al. ........... | 365/200 |
| 6,362,502 B1 | * | 3/2002 | Rosner et al. ........... | 257/298 |
| 6,967,878 B2 | * | 11/2005 | Dono ..................... | 365/200 |

| | | | |
|---|---|---|---|
| 2003/0026142 A1 | 2/2003 | Yamada | |
| 2004/0165456 A1 | 8/2004 | Yamada | |

FOREIGN PATENT DOCUMENTS

| | | |
|---|---|---|
| JP | 09-128991 | 5/1997 |
| JP | 2003-051199 | 2/2003 |

OTHER PUBLICATIONS

"Eight Character 5.0 mm (0.2 inch) Glass/Ceramic Intelligent 5×7 Alphanumeric Displays for Military Applications, Technical Data", Jul. 19, 2004, Agilent Technologies.*

* cited by examiner

*Primary Examiner*—Amir Zarabian
*Assistant Examiner*—Michael Weinberg
(74) *Attorney, Agent, or Firm*—Fish & Richardson P.C.

(57) ABSTRACT

The present invention provides a high-capacity and reliable semiconductor device which does not require additional circuits for use at power ON/OFF, additional steps nor high manufacturing cost, and which has a rectifier means for rectifying a defect easily. A semiconductor device comprises a first memory means including a memory cell and a redundant memory cell each including a memory element in the region where a bit line and a word line cross each other with an insulator interposed therebetween, a second memory means for storing an address of a defective memory in the first memory means, a rectifier means including a holding means and a replacement means, and an inspection means for writing data of the second memory means to the holding means. The replacement means replaces the defective memory cell with the redundant memory cell. In addition to the aforementioned four means, a display means for displaying images is provided as well.

8 Claims, 6 Drawing Sheets

SEMICONDUCTOR DEVICE FOR RECTIFYING MEMORY DEFECTS

BACKGROUND OF THE INVENTION

1. Field of the Invention

The present invention relates to a semiconductor device comprising a plurality of blocks. More particularly, the invention relates to a semiconductor device comprising at least two blocks that are a memory means and a rectifier means for rectifying a defect in the memory means.

2. Description of the Related Art

One-chip semiconductor devices each comprising a plurality of blocks (also referred to as system LSIs) have been actively developed. Recently, higher integration of semiconductor devices as well as the manufacture of readable/writable memory means (also referred to as a memory or a RAM) is under development in accordance with the demand for further downsizing and higher performance of the devices. Such a memory means is required to have high capacity and reliability.

As a method for rectifying defects of a semiconductor device, there is the mainstream technique of replacing a defective memory cell with a redundant memory cell. Generally in such a technique, a fusion method is employed in which a fuse is blown by a laser.

There is known a method of translating an address which specifies a defective portion into an address of a redundant memory cell by using a memory means including a dielectric body (also referred to as an FRAM) (see Patent Document 1). There is known another method of inactivating a selection signal line in a defective portion by shifting selection signal lines of memory cells by using a memory means including a dielectric body (see Patent Document 2). Each of the methods in Patent Documents 1 and 2 is superior to the fusion method in that no expensive device is required for the fusion and thus a problem of area penalty which requires a larger mounting area in accordance with the manufacture of fusion can be addressed.

[Patent Document 1] Japanese Patent Laid-Open No. Hei 9-128991

[Patent Document 2] Japanese Patent Laid-Open No. 2003-51199

As for the memory means including a dielectric body described in Patent Documents 1 and 2, complex sequence control is required. Specifically, it is required when powering ON the memory means that a potential of a wiring called a plate line is maintained constant in order to restore dielectric polarization. In addition, when powering OFF the memory means, it is required that a signal is transmitted to the plate line in order to hold the logic of the dielectric polarization.

In addition, in the methods described in Patent Documents 1 and 2, a memory means for storing an address of a defective memory cell is formed over the same substrate as a memory cell array, and an FRAM including a TFT and a capacitor having a ferroelectric thin film is used. When a ferroelectric film is used, the number of masks and additional steps, and manufacturing cost are inevitably increased.

In view of the foregoing problems, it is a feature of the invention to provide a semiconductor device which does not require complex sequence control. It is another feature of the invention to provide a semiconductor device which does not require additional steps nor high manufacturing cost. It is still another feature of the invention to provide a semiconductor device comprising a rectifier means for rectifying a defect with a simple method to achieve a high-capacity and reliable semiconductor device.

SUMMARY OF THE INVENTION

In order to solve the foregoing problems, the invention takes the following measures.

A semiconductor device in accordance with the invention comprises a first memory means including a memory cell and a redundant memory cell each including a memory element in the region where a bit line and a word line cross each other with an insulator interposed therebetween, a second memory means for storing an address of a defective memory cell in the first memory means, a rectifier means including a holding means and a replacement means, and an inspection means for writing data of the second memory means to the holding means, wherein the replacement means replaces the function of the defective memory cell with the redundant memory cell.

Among the aforementioned four means, three means that are the first memory means, the rectifier means and the inspection means are formed over the same substrate while the second memory means is connected to a connecting terminal of the substrate. Alternatively, all of the four means are provided over the same substrate. Accordingly, a compact, thin and lightweight semiconductor device can be provided.

According to the invention, a display means for displaying images may be provided in addition to the aforementioned four means, in which case the invention has a total of five means. Among the five means, four means that are the first memory means, the rectifier means, the inspection means and the display means are formed over the same substrate while the second memory means is connected to a connecting terminal of the substrate. Alternatively, all of the five means are provided over the same substrate. Accordingly, a compact, thin and lightweight semiconductor device can be provided. Further, with the addition of the display means, a high-performance and high value-added semiconductor device can be provided.

The first memory means includes a means for storing data of 2 bits or more. The first memory means is an SRAM (Static Random Access Memory) or a DRAM (Dynamic Random Access Memory).

In the case where the first memory means and the second memory means are not formed over the same substrate, the second memory means is a readable/writable memory means or a read only memory means, for example, such as an EPROM (Electrically Programmable Read Only Memory), an EEPROM (Electrically Erasable Read Only Memory), a flash memory, a mask ROM (Read Only Memory) and a PROM (Programmable Read Only Memory). In the aforementioned structure, the first memory means and the second memory means are not formed over the same substrate. However, the first memory means is required to be formed over the same substrate as another memory means for storing data of the defective memory cell in the first memory means. That is, although the second memory means stores data of the defective memory cell in the first memory means, it is required that another means for storing the data of the defective memory cell which is different from the second memory means is formed over the same substrate as the first memory means. In the aforementioned structure, a holding means which corresponds to a latch is used as a means for storing data of the defective memory cell. When the holding means is used, a dedicated writing circuit is required. In the aforementioned structure, an inspection means is used as the means for writing data. Accordingly, no additional dedicated circuit for writing data to the holding means is required, thus a semiconductor device with small area penalty can be provided. In addition, according to the invention, the second memory means is not required to be formed over the same substrate as the first memory means, therefore, a semiconductor device which does not require additional steps nor high manufacturing cost can be provided. Further, when the invention is compared with the case of using an FRAM, no complex sequence control is required, thus a semiconductor device with small area penalty can be provided.

Meanwhile, in the case where the first memory means and the second memory means are formed over the same substrate, the second memory means is an EPROM, an EEPROM or a flash memory. The second memory means includes a means for storing data of 2 bits or more.

The inspection means includes a flip-flop group and an interface. The inspection means is typically used only for inspection, however in the invention, it is also used for writing data of the second memory means to the holding means. Accordingly, data of the defective memory cell can be written to the holding means with a simple method, and thus the defect in the first memory means can be rectified with a simple method. Thus, the high-capacity and reliable first memory means can be provided.

The replacement means includes a selection means for selecting a bit line or a word line of the address where the redundant memory cell is disposed and for unselecting a bit line or a word line of the address where the defective memory cell is disposed, and a potential setting means for setting the bit line or the word line of the address where the defective memory cell is disposed at the same potential as a low potential power source (also referred to as VSS).

In addition, the replacement means includes a selection means for unselecting a bit line or a word line of the address where the memory cell is disposed and for selecting only a bit line or a word line of the address where the redundant memory cell is disposed, and a potential setting means for setting a bit line or a word line of the address where the defective memory cell is disposed at the same potential as a high potential power source (also referred to as VDD).

According to the invention, in which the three means that are the first means, the rectifier means and the inspection means, or the second memory means in addition to the three means are provided over the same substrate, a compact, thin and lightweight semiconductor device can be provided. Further, a display means may be formed over the same substrate in addition to the three or four means, in which case a high-performance and high value-added semiconductor device can be provided.

According to the invention in which the second memory means is connected to a connecting terminal of a substrate where the first memory means is provided, no additional dedicated circuit for writing data to the holding means is required, thus a semiconductor device with small area penalty can be provided. In addition, according to the invention, the second memory means is not required to be formed over the same substrate as the first memory means, therefore, a semiconductor device which does not require additional steps nor high manufacturing cost can be provided. Further, when the invention is compared with the case of using an FRAM, no complex sequence control is required, thus a semiconductor device with small area penalty can be provided.

According to the invention which uses a flip-flop group as an inspection means, data of a defective memory cell can be written to a holding means with a simple method, thus a defect in the first memory means can be rectified with a simple method. Accordingly, the high-capacity and reliable first memory means can be provided.

DETAILED DESCRIPTION OF THE INVENTION

The invention will be described with reference to specific exemplary embodiment modes and drawings. It will, however, be evident that various modifications and changes may be made thereto without departing from the broader spirit and scope of the invention as set forth in the appended claims. Accordingly, the specification and drawings are to be regarded in an illustrative rather than a restrictive sense.

[Embodiment Mode 1]

Figure 1A:
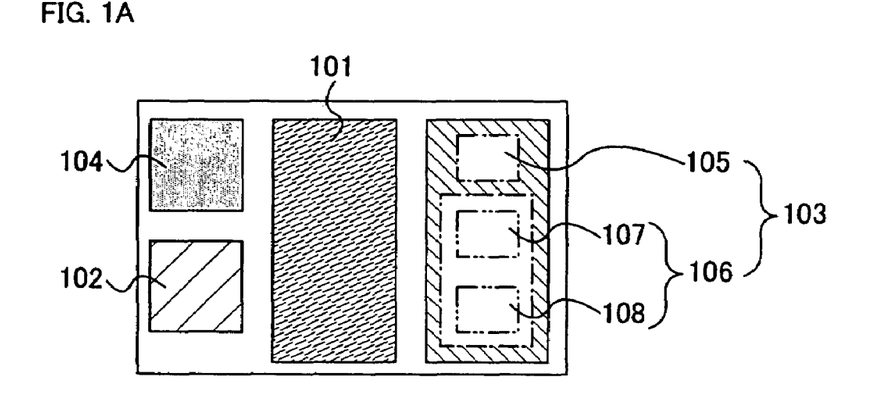
FIGS. 1A and 1B are diagrams illustrating a semiconductor device in accordance with the invention (Embodiment Mode 1).

A semiconductor device in accordance with the invention comprises four primary components: a first memory means 101 (also referred to as a first memory circuit) including a memory cell and a redundant memory cell each including a memory element in the region where a bit line and a word line cross each other with an insulator interposed therebetween, a second memory means 102 (also referred to as a second memory circuit) for storing an address of a defective memory cell in the first memory means, a rectifier means 103 (also referred to as a rectifier circuit) and an inspection means 104 (also referred to as an inspection circuit) (see FIG. 1A).

The rectifier means 103 includes a holding means 105 (also referred to as a holding circuit) and a replacement means 106 (also referred to as a replacement circuit). The inspection means 104 includes a means for writing data of the second memory means 102 to the holding means 105. Further, the replacement means 106 includes a means for replacing the function of a defective memory cell with the redundant memory cell.

More particularly, the replacement means 106 includes a selection means 107 for selecting a bit line or a word line of the address where a redundant memory cell is disposed and for unselecting a bit line or a word line of the address where a defective memory cell is disposed, and a potential setting means 108 for setting the bit line or the word line of the address where the defective memory cell is disposed at the same potential as the low potential power source.

Three means that are the first memory means 101, the rectifier means 103 and the inspection means 104 are provided over the same substrate while the second memory means 102 is connected to a connecting terminal of the substrate. Alternatively, all of the aforementioned four means are provided over the same substrate. Accordingly, a compact, thin and lightweight semiconductor device can be provided.

Figure 1B:
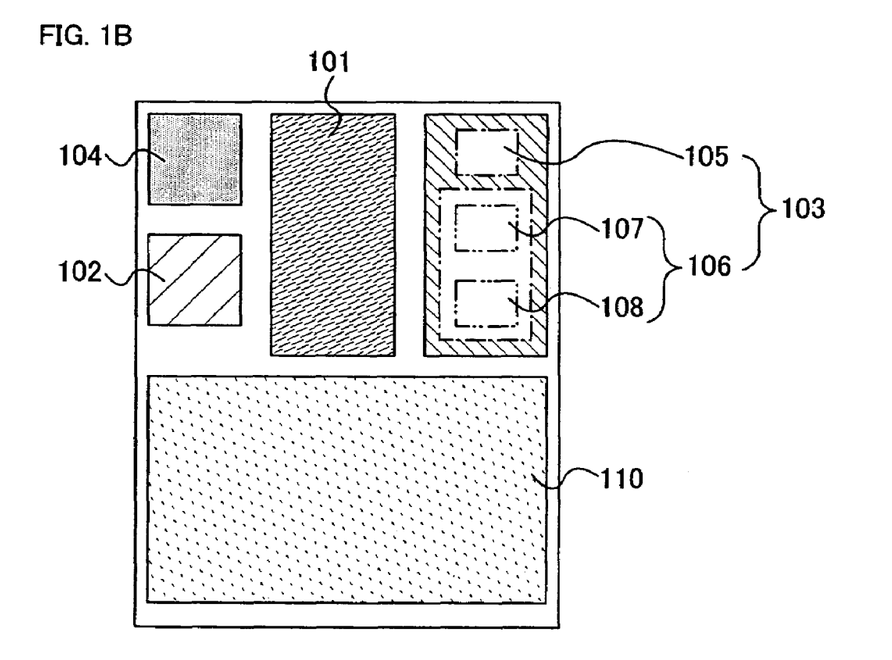

According to the invention, a display means 110 for displaying images may be provided in addition to the aforementioned four means (see FIG. 1B). The four means that are the first memory means 101, the rectifier means 103, the inspection means 104 and the display means 110 are formed over the same substrate while the second memory means 102 is connected to a connecting terminal of the substrate. Alternatively, all of the aforementioned five means are provided over the same substrate. Accordingly, a compact, thin and lightweight semiconductor device can be provided. Further, with the addition of the display means 110, a high-performance and high value-added semiconductor device can be provided.

The connecting terminal is connected to a circuit provided over the substrate (hereinafter referred to as an internal circuit) and a connecting film is attached thereto via a conductors such as a conductive particle. The connecting film is a thin LSI (Large Scale Integration) package in which an LSI chip is mounted over a printed circuit film, and also referred to as a TCP or a TAB-IC. The connecting film is connected to IC (Integrated Circuit) chips (hereinafter referred to as external circuits). Accordingly, the internal circuit and the external circuits are connected to each other via the connecting terminal and the connecting film. Such connection of the internal circuit and the external circuits through the connecting film is also referred to as the attachment of external circuits.

Description is given below on the configuration of each of the aforementioned means with reference to FIG. 2. A memory cell array 11 corresponding to the first memory means includes bit lines B1 to Bn (n is a natural number) in the first to the n-th columns and word lines W1 to Wm (m is a natural number) in the first to the m-th rows. It also comprises a plurality of memory cells 12 each including a memory element in the region where the bit line Bx ($1 \leq x \leq n$) and the word line Wy ($1 \leq y \leq m$) cross each other with an insulator interposed therebetween. The memory element is configured with one or more elements selected from a TFT (Thin Film Transistor), a capacitor element and a resistor element. This embodiment mode shows an example where m=4 is satisfied, and a TFT 13 and a capacitor element 14 are used as the memory elements. One of the two electrodes of the capacitor element 14 is connected to the low potential power source.

Figure 2:
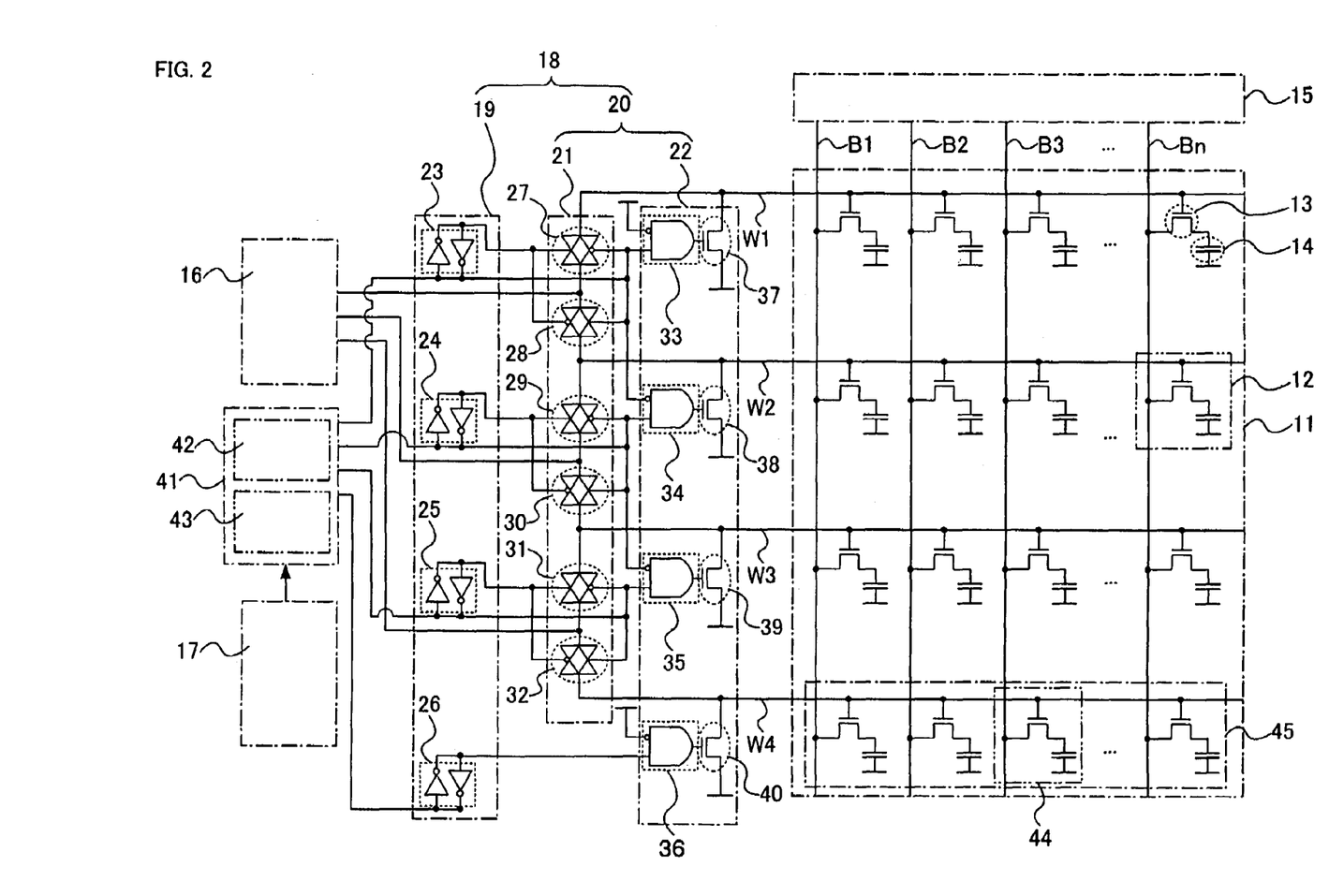
FIG. 2 is a diagram illustrating a semiconductor device in accordance with the invention (Embodiment Mode 1).

Note that the example shown in FIG. 2 is the case where the memory cell array 11 corresponds to a DRAM. In the case where the memory cell array 11 corresponds to an SRAM, the following are used as the memory elements: six TFTs, five TFTs, combination of four TFTs and two resistor elements, or combination of four TFTs and one resistor element. Note that in the case where the six TFTs or the combination of four TFTs and two resistor elements are employed as the memory elements, two bit lines (one corresponds to a bit line and the other corresponds to a bit bar line) are disposed in each column.

The memory cell array 11 includes a redundant memory cell array including one redundant memory cell or a plurality of redundant memory cells. In general, the memory cell array 11 includes one or more columns of, or one or more rows of redundant memory cell arrays. This embodiment mode shows an example where a redundant memory cell array 45 including one row of redundant memory cells 44 is provided, and the redundant memory cell array 45 is disposed in the fourth row. Accordingly, the word line W4 in the fourth row is also referred to as a redundant word line.

On the periphery of the memory cell array 11, a decoder 15 for controlling the bit lines the B1 to Bn in columns, and a decoder 16 for controlling the word lines W1 to Wm in rows are disposed. Note that in addition to the decoders, other circuits such as a sense amplifier, a read/write circuit and an output circuit may be provided if necessary (not shown).

A second memory means 17 stores an address of one or more defective memory cells in the memory cell array 11. Data of the defective memory cell is obtained at first by an inspection means such as a tester. The second memory means 17 is a readable/writable memory such as an EPROM, an EEPROM and a flash memory, or a read only memory such as a mask ROM and a PROM.

A rectifier means 18 includes a holding means 19 and a replacement means 20. The replacement means 20 includes a selection means 21 and a potential setting means 22. The rectifier means 18 is disposed in one or both of the column and row directions. This embodiment mode shows an example where the rectifier means 18 is disposed only in the row direction.

The holding means 19 corresponds to a register including a plurality of latches. In this embodiment mode, the register includes the same number of latches as that of the bit lines B1 to Bn and the word lines W1 to Wm. That is, n latches are disposed in columns while m latches are disposed in rows. This embodiment mode shows an example where m=4 is satisfied, therefore, the holding means 19 corresponds to a register including four latches 23 to 26 which is the same number as the word lines W1 to W4.

The selection means 21 corresponds to an element group including a plurality of switching elements such as TFTs. This embodiment shows an example where the element group corresponds to a plurality of analog switches. The number of the analog switches is twice as large as the number obtained by subtracting the number of the redundant bit lines from that of the bit lines B1 to Bn or that of the word lines W1 to Wm. Accordingly, the number of the word lines W1 to W4 is four, and the number of the redundant word line W4 is one, thus the selection means 21 corresponds to an element group which includes (4−1)×2=6 analog switches 27 to 32.

The potential setting means 22 corresponds to an element group including a plurality of logic circuits and switching elements. This embodiment mode shows an example where the element group corresponds to a plurality of logic circuits and TFTs, and the number of the logic circuits and the number of the TFTs are the same as that of the bit lines B1 to Bn or the word lines W1 to Wm. Accordingly, since the number of the word lines W1 to W4 is four, the potential setting means 22 corresponds to an element group including four logic circuits 33 to 36 and four TFTs 37 to 40. One of the two input terminals of the respective logic circuits 33 and 36 is connected to the low potential power source. The TFTs 37 to 40 are N-channel TFTs, and either the sources or drains of the TFTs 37 to 40 are connected to the low potential power source while the others are connected to the word line Wy ($1 \leq y \leq 4$).

An inspection means 41 corresponds to an element inspection means 42 and an interface 43 for controlling the element inspection means 42. The element inspection means 42 is one of the IC chip inspection methods, and it is only required to meet the JTAG standard which is a name of a standard method for a boundary scan test. The element inspection means 42 can perform inspection of all the TFTs which configure a semiconductor device. As a specific example, a flip-flop group including a plurality of flip-flop circuits in cascade connection (also referred to as a shift register) may be employed. A flip-flop group which meets the JTAG standard is also called a scan chain. The interface 43 controls the element inspection means 42. Specifically, it reads out data of the second memory means 17, supplies it to the element inspection means 42 and supplies data which is supplied from the element inspection means 42 to the rectifier means 18. The use of the flip-flop group as the inspection means 41 in accordance with the invention makes it easier to write data of a defective memory cell. Accordingly, a defect in the memory cell array 11 can be rectified easily, which can enhance the capacity and reliability of the memory cell array 11. Note that the inspection means 41 is used only at power ON and inspection, and it is used for writing an address of a defective memory cell to the holding means 19 at power ON.

Description is made now on the operation of a semiconductor device having the aforementioned configuration. In this embodiment mode, description is made on the operation of rectifying a defective memory cell by using a redundant memory cell on the assumption that the defective memory cell is disposed in the second row.

First, when the semiconductor device is turned ON, the inspection means 41 reads out data of the address of the defective memory cell from the second memory means 17, and supplies it to the holding means 19 in the rectifier means 18. Specifically, L-level signals are supplied to the latches 23, 25 and 26 in the first, third and fourth rows respectively while an H-level signal is supplied to the latch 24 in the second row. The latches 23 to 26 each holds the supplied signal. In other words, the latches 23 to 26 each stores the same data as that of the address of the defective memory cell in the second memory means 17.

Once each of the latches 23 to 26 holds a predetermined signal, the analog switches 27, 30 and 32 are turned ON while the analog switches 28, 29 and 31_are turned OFF according to the data. In addition, the TFTs 37, 39 and 40 are turned OFF while the TFT 38 is turned ON.

Once the aforementioned state is obtained, the word line W1 in the first row is connected to the decoder 16 via the analog switch 27. The word line W2 in the second row is connected to the decoder 16 via the analog switch 30. The redundant word line W4 in the fourth row is connected to the decoder 16 via the analog switch 32. On the other hand, the word line W2 in the second row is not connected to the decoder 16 since the analog switches 28 and 29 are OFF. Further, the word line W2 in the second row is at the same potential as the low potential power source since the TFT 38 is ON.

Through the aforementioned steps, the defective memory cell in the second row is rectified by the redundant memory cell in the fourth row. More specifically, the selection means 21 selects only the word lines W1 and W3 in the first and third rows and the redundant word line W4 in the fourth row while unselecting the word line W2 in the second row based on the data stored in the holding means 19. The potential setting means 22 sets the word line W2 in the second row which is not selected at the same potential as the low potential power source. That is, reading/writing of data that is to be performed to the memory cell 12 in the second row is performed to the memory cell 12 in the third row. Similarly, reading/writing of data that is assumed to be performed to the memory cell 12 in the third row is performed to the redundant memory cell 44 in the fourth row. In this manner, the memory cell 12 in the second row is replaced by the memory cell 12 in the third row, and the memory cell 12 in the third row is replaced by the redundant memory cell 44 in the fourth row. Consequently, the defective memory cell in the second row is rectified by the redundant memory cell 44 in the fourth row.

[Embodiment Mode 2]

A semicoducter device in accordance with the invention comprises four primary components: a first memory means including a memory cell and a redundant memory cell each including a memory element in the region where a bit line and a word line cross each other with an insulator interposed therebetween, a second memory means for storing an address of a defective memory cell in the first memory means, a rectifier means and an inspection means.

The rectifier means includes a holding means and a replacement means. The inspection means includes a means for writing data of the second memory means to the holding means. Further, the replacement means including a means for replacing the function of the defective memory cell with the redundant memory cell.

More specifically, the replacement means includes a selection means for selecting only a bit line or a word line of the address where a redundant memory cell is disposed and for unselecting a bit line or a word line of the address where a memory cell is disposed, and a potential setting means for setting a bit line or a word line of the address where a defective memory cell is disposed at the same potential as the high potential power source.

Three means that are the first memory means, the rectifier means and the inspection means are formed over the same substrate while the second memory means is connected to a connecting terminal of the substrate. Alternatively, the aforementioned four means are formed over the same substrate. Accordingly, a compact, thin and lightweight semiconductor device can be provided.

According to the invention, a display means for displaying images may be provided in addition to the aforementioned four means. In that case, four means that are the first memory means, the rectifier means, the inspection means and the display means are formed over the same substrate while the second memory means is connected to a connecting terminal of the substrate. Alternatively, all of the aforementioned five means are provided over the same substrate. Accordingly, a compact, thin and lightweight semiconductor device can be provided. Further, with the addition of the display means, a high-performance and high value-added semiconductor device can be provided.

Figure 3:
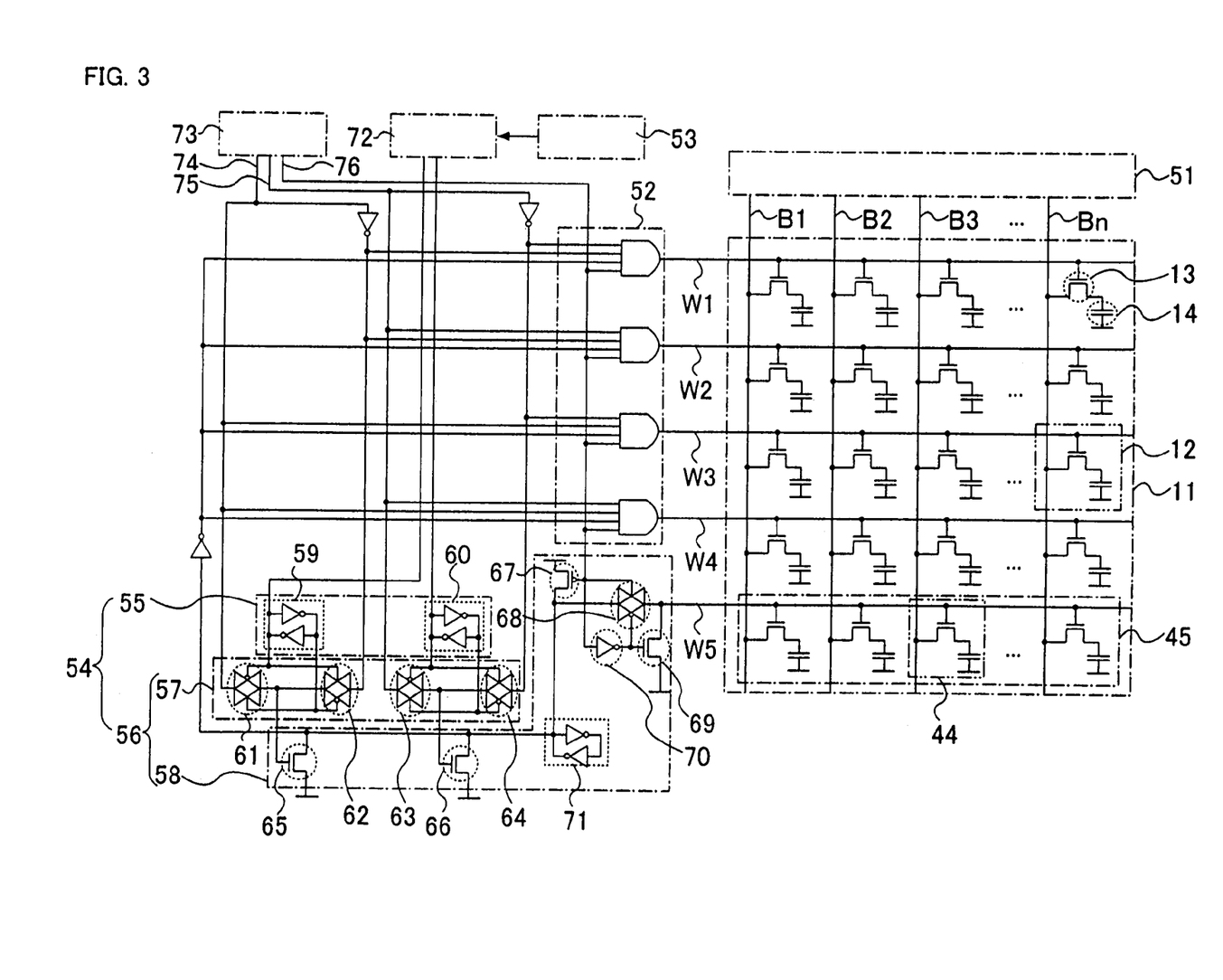
FIG. 3 is a diagram illustrating a semiconductor device in accordance with the invention (Embodiment Mode 2).

Description is given now on the configuration of each of the aforementioned means with reference to FIG. 3. The memory cell array 11 corresponding to the first memory means includes a plurality of the bit lines B1 to Bn and a plurality of the word lines W1 to Wm. It also includes a plurality of memory cell 12 each including a memory element in the region where the bit line Bx ($1 \leq X \leq n$) and the word line Wy (1 y m) cross each other with an insulator interposed therebetween. The memory element is configured with one or more elements selected from a TFT, a capacitor element and a resistor element. This embodiment mode shows an example where M=5 is satisfied, and the TFT 13 and the capacitor element 14 are used as the memory elements.

The memory cell 11 includes a redundant memory cell array including one redundant memory cell or a plurality of redundant memory cells. This embodiment mode shows an example where the redundant memory cell array 45 includes one row of the redundant memory cell 44, and the redundant memory cell array 45 is disposed in the fifth row. Accordingly, the word line W5 in the fifth row is also referred to as a redundant word line.

On the periphery of the memory cell array 11, a decoder 51 for controlling the bit lines B1 to Bn in columns, and a decoder 52 for controlling the word lines W1 to Wm in rows are disposed. Note that in addition to the decoders, other circuits such as a sense amplifier, a read/write circuit and an output circuit may be provided if necessary (not shown).

A second memory means 53 store an address of one or more defective memory cell in the memory cell array 11. The second memory means 53 is a readable/writable memory such as an EEPROM, an EEPROM and a flash memory, or a read only memory such as a mask ROM and a PROM.

A rectifier means 54 includes a holding means 55 and a replacement means 56. The replacement means 56 includes a selection means 57 and a potential setting means 58. The rectifier means 54 is disposed in one or both of the column and row directions. This embodiment shows an example wheel the rectifier means 54 is disposed only in the row direction.

The holding means 55 corresponds to a register including a plurality of latches. In this embodiment mode, the holding means 55 corresponds to a register including two latches 59 and 60.

The selection means 57 corresponds to an element group including a plurality of switching elements such as TFTs. This embodiment shows an example where the element group corresponds to the one including a decoder and a plurality of analog switches. More specifically, it corresponds to an element group including a decoder 52 in the row direction and four analog switches 61 to 64. The analog switches 61 to 64 are connected to a CPU (Central Processing Unit) 73.

The potential setting means 58 corresponds to an element group including switching elements such as TFTs. In this embodiment mode, it corresponds to an element group including N-channel TFTs 65 and 66, a P-channel TFT 67, an analog switch 68, an N-channel TFT 69, an inverter 70 and a latch 71. The sources or drains of the respective N-channel TFTs 65, 66 and 69 are connected to the low potential power source. The source or drain of the P-channel TFT 67 is connected to the high potential power source.

An inspection means 72 includes an element inspection means typified by a flip-flop group and an interface. The inspection means 72 is connected to the latches 59 and 60 as the holding means 55. The use of the flip-flop group as the inspection 25 means 72 in accordance with the invention makes it easier to write data of a defective memory cell. Accordingly, a defect in the memory cell array 11 can be rectified easily, which can enhance the capacity and reliability of the memory cell array 11.

The CPU 73 corresponds to an element group including a plurality of switching elements such as TFTs. The CPU 73 supplies a signal for selecting one predetermined word line Wy ($1 \leq y \leq 4$) which is selected from the four word lines W1 to W4. It also supplies a DE (Decode Enable) signal.

Description is made now on the operation of a semiconductor device having the aforementioned configuration. In this embodiment mode, description is made on the operation of rectifying a defective memory cell by using a redundant memory cell on the assumption that the defective memory cell is disposed in the second row.

First, when the semiconductor device is turned ON, the inspection means 72 reads out data of the defective memory cell from the second memory means 53, and supplies it to the holding means 55 in the rectifier means 54. Specifically, the inspection means 72 supplies a signal for unselecting the word line W2 in the second row. More specifically, an L-level signal is supplied to the latch 59 while an H-level signal is supplied to the latch 60. The latches 59 and 60 each holds the supplied signal. In other words, the latches 59 and 60 each stores the same data as that of the address of the defective memory cell in the second memory means 53.

Once each of the latches 59 and 60 stores the data of the defective memory cell, the analog switches 61 and 63 are turned ON while the analog switches 62 and 64 are turned OFF according to the data.

Description is made now on the operation in the aforementioned state in both cases where the DE signal is L level and H level.

When the DE signal supplied from the CPU 73 is L level, all the bit lines W1 to Wm are pre-charged. In addition, the P-channel TFT 67 is turned ON, and the latch 71 holds the potential of the high potential power source which is connected to the source or drain of the P-channel TFT 67. That is, the latch 71 holds an H-level signal.

On the other hand, when the DE signal is H level, the word line Wy ($1 \leq y \leq 4$) is selected, and data is read from/written to the predetermined memory cell 12. Description is made now on the operation in the case where the DE signal is H level and the data for selecting the word line in the second row is selected. First, an L-level signal is transmitted to a wiring 74 while an H-level signal is transmitted to a wiring 75 from the CPU 73. Then, the L-level signal is supplied to the N-channel TFT 65 via the analog switch 61, thereby the N-channel TFT 65 is turned OFF. Similarly, the N-channel TFT 66 is turned OFF. At this time, the analog switch 68 is ON, and the H-level signal held in the latch 71 is transmitted to the redundant word line W5, thus the redundant word line W5 is at the same potential as the high potential power source. That is, the redundant word line W5 is selected. On the other hand, the word lines W1 to W4 are not selected.

Now, description is made on the operation in the case where the DE signal is H level and the word line Wy (y=1, 3 or 4) is selected. First, signals are transmitted to the wirings 74 and 75 from the CPU 73. More specifically, H-level signals are transmitted to both the wirings 74 and 75, or an H-level signal and an L-level signal are transmitted to the wirings 74 and 75 respectively. Alternatively, L-level signals are transmitted to both the wirings 74 and 75. These signals select the word line Wy (y=1, 3 or 4), and turn ON one or both of the N-channel TFTs 65 and 66. At this time, the analog switch 68 is ON, and a potential of the low potential power source which is connected to the sources or drains of the N-channel TFTs 65 and 66 is transmitted to the redundant word line W5, whereby the word line W5 reaches the same potential as the low potential power source. That is, the redundant word line W5 is not selected. On the other hand, the word line Wy (y=1, 3 or 4) is selected.

Through the aforementioned steps, the defective memory cell in the second row is rectified by the redundant memory cell in the fifth row. More specifically, in the case where data for selecting the word line in the second row is supplied from the CPU 73 based on the data stored in the holding means 19, the selection means 57 unselects the word line Wy ($1 \leq y \leq m$) and selects only the redundant word line W5. At the same time, the potential setting means 58 sets the redundant word line W5 at the same potential as the high potential power source. That is, the redundant word line W5 is selected. In this manner, the defective memory cell in the second row is rectified by the redundant memory cell in the fifth row. On the other hand, in the case where the word line Wy (y=1, 3 or 4) is selected, the selection means 57 selects the word line Wy (y=1, 3 or 4) and unselects the redundant word line W5. In addition, the potential setting means 58 sets the redundant word line W5 at the same potential as the low potential power source. That is, the redundant word line W5 is not selected. This embodiment mode can be appropriately implemented in combination with the aforementioned embodiment mode.

[Embodiment Mode 3]

Figure 4A:
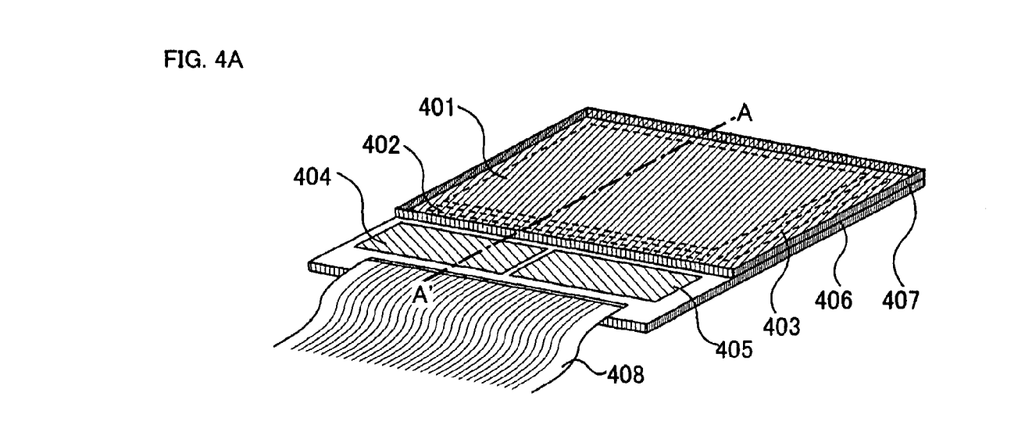
FIGS. 4A and 4B are diagrams illustrating a semiconductor device in accordance with the invention (Embodiment Mode 3).
Figure 4B:
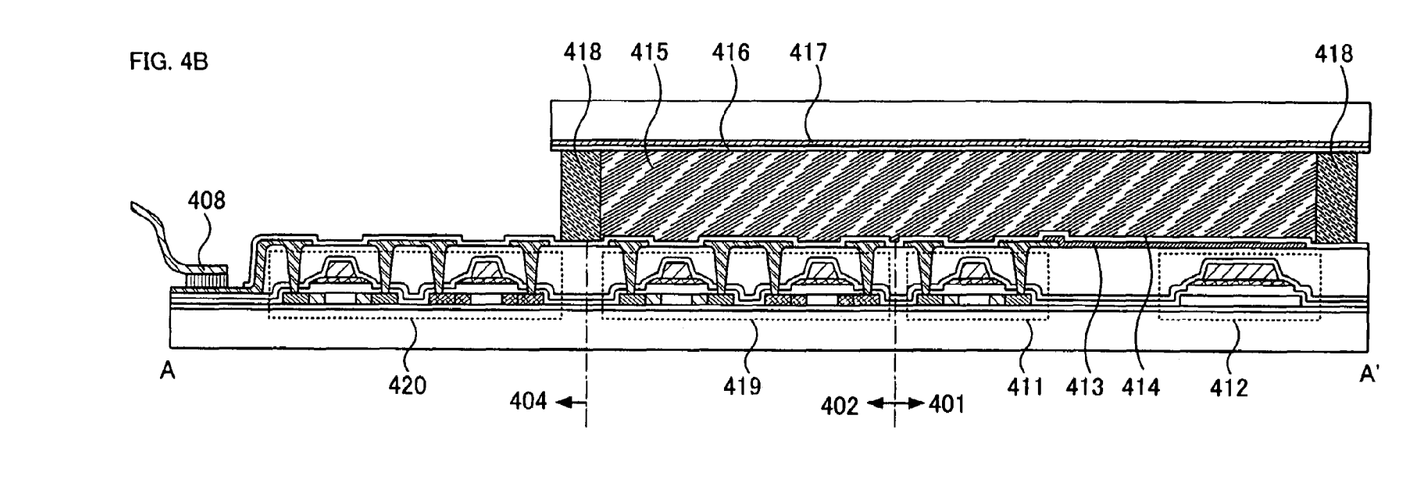

Description is made now on one embodiment mode of the invention with reference to the drawings. Referring to FIGS. 4A and 4B, a panel in which a pixel portion, a driver circuit for controlling the pixel portion, a memory and a CPU are all mounted over the same surface is described.

FIG. 4A shows a perspective view of a panel which comprises a substrate 406 over which are formed a pixel portion 401 including a plurality of pixels in a matrix array and driver circuits 402 and 403 on the periphery of the pixel portion 401. The panel also comprises a memory means 404 which corresponds to a VRAM (Video Random Access Memory), a RAM or a ROM, and a CPU 405. The panel further comprises an input terminal 409 to be supplied with signals for controlling the driver circuits 402 and 403, the memory means 404 and the CPU 405. The input terminal 409 is supplied with signals such as video signals and potentials via a tape 408. A sealing member (not shown) is provided so as to surround the pixel portion 401 and the driver circuits 402 and 403, with which the substrate 406 is attached to a counter substrate 407. The counter substrate 407 may be provided only over the pixel portion 401 and the driver circuits 402 and 403, or over the entire surface. Note the CPU 405 which may generate heat is preferably provided with a heat sink.

FIG. 4B shows a cross-sectional view of the panel taken along a line A–A' in FIG. 4A, in which the pixel portion 401 comprises a TFT 411 and a capacitor element 412, the driver circuit 402 comprises an element group 419 including TFTs, and the memory means 404 comprises an element group 420 including TFTs. Between the substrate 406 and the counter substrate 407, a pixel electrode 413, an alignment film 414, a liquid crystal layer 415, an alignment film 416, a counter electrode 417 and a sealing member 418 are provided. The substrate 406 and the counter substrate 407 are attached with polarizing plates respectively (not shown).

Circuit elements over the substrate 406 are preferably formed of polycrystalline semiconductors (polysilicon) which are superior in characteristics such as mobility as compared to amorphous semiconductors, whereby monolithic integration over the same surface can be achieved. In this manner, a panel integrating functional circuits such as memory means and a CPU as well as a pixel portion and driver circuits is called a "System-on-Panel" which can implement a multifunctional system. The panel having the aforementioned structure has a smaller number of external ICs to be connected. Therefore, compactness, light weight and thinness can be achieved, and such panel can be advantageously applied to a portable terminal which is in widespread use currently.

Note that this embodiment mode illustrates an exemplary panel using liquid crystal elements as display elements, however, the invention is not limited to this. A panel using other display elements such as light emitting elements can be adopted as well. This embodiment mode can be appropriately implemented in combination with the aforementioned embodiment modes.

[Embodiment 1]

Figure 5A:
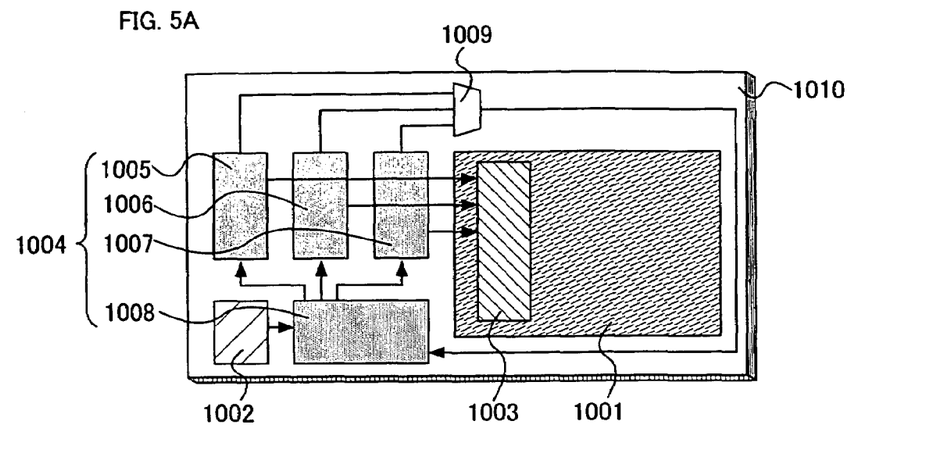
FIGS. 5A and 5B are diagrams illustrating a semiconductor device in accordance with the invention (Embodiment 1).

Description is made now on an embodiment of the invention with reference to FIG. 5A. A semiconductor device in accordance with the invention comprises a substrate 1010 over which are mounted a first memory means 1001 including a memory cell and a redundant memory cell (hereinafter referred to as an RAM 1001), a second memory means 1002 for storing an address of a defective memory cell (hereinafter referred to as a ROM 1002), a rectifier means 1003, and an inspection means 1004 for writing data of the ROM 1002 to the rectifier means 1003. The inspection means 1004 includes scan chains 1005 to 1007 and a scan controller 1008. In addition, a selector 1009 is provided between the scan chains 1005 to 1007 and the scan controller 1008.

The rectifier means 1003 is provided in the RAM 1001 in the shown configuration, however, the rectifier means 1003 may be provided outside the RAM 1001. Further, the ROM 1002 may be formed outside the substrate 1002, and be attached externally. The components of the semiconductor device in accordance with the invention are not limited to the aforementioned ones, and it may comprise several independent circuit blocks such as a CPU, a DSP (Digital Signal Processor), a memory controller, a PLL (Phase Locked Loop) and a power source circuit.

Description is made now on the operation of a semiconductor device having the aforementioned configuration. First, when the semiconductor device is powered ON, the scan chain controller 1008 reads out data of an address of a defective memory cell from the ROM 1002, which is subsequently transmitted to the scan chains 1005 to 1007. The data transmitted to the scan chains 1005 to 1007 is written to the rectifier means 1003. Based on the data, the rectifier means 1003 rectifies the defective memory cell by using a redundant memory cell.

Figure 5B:
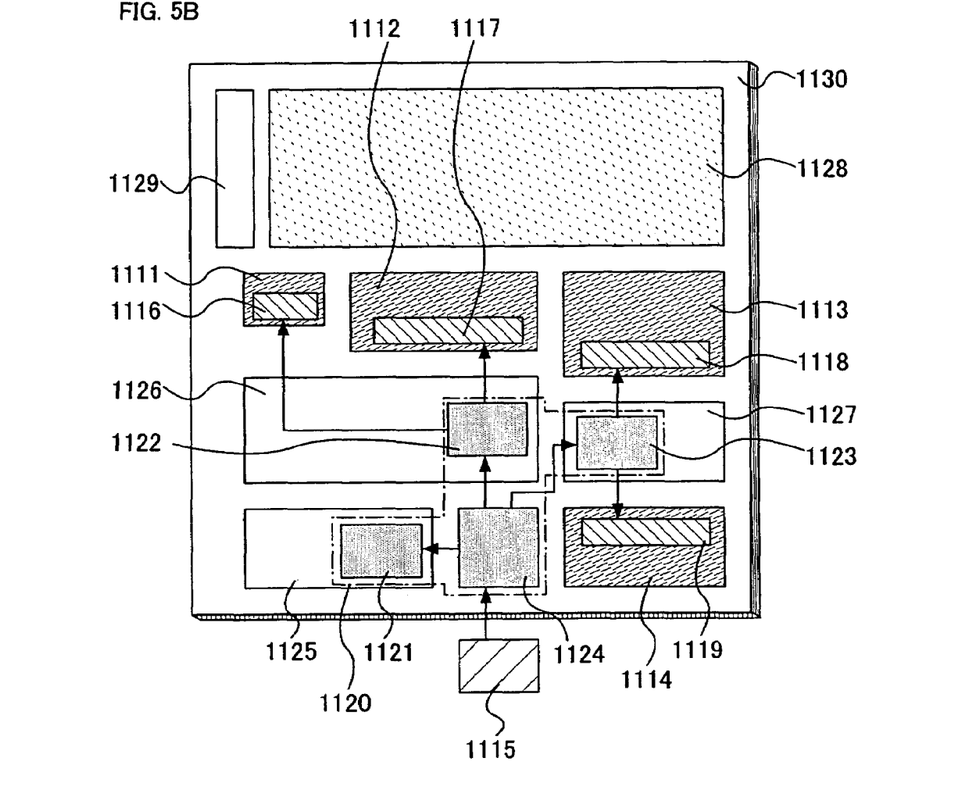

Now, description is made on an embodiment of the invention having different components from the aforementioned ones with reference to FIG. 5B. A semiconductor device in accordance with the invention comprises a substrate 1130 over which are formed first memory means 1111 to 1114 including a plurality of memory cells (hereinafter referred to as a color palette memory 1111, a video memory 1112, a work memory 1113 and a program memory 1114), a second memory means 1115 for storing an address of a defective memory cell (hereinafter referred to as a ROM 1115), rectifier means 1116 to 1119 and an inspection means 1120 for writing data of the ROM 1115 to the rectifier means 1116 to 1119. The inspection means includes scan chains 1121 to 1123 and a scan chain controller 1124. The scan chains 1121 to 1123 are incorporated in an interface 1125 for transmitting/receiving data to/from external circuits, an image signal processing circuit 1126 for processing image data and a CPU 1127 respectively. The semiconductor device further comprises a display means 1128 including a plurality of pixels and displaying images therein, and a driver circuit 1129 for controlling the display means 1128.

Each of the scan chains 1121 to 1123 is incorporated in the other circuit in the shown configuration, however, it may be provided separately. In addition, one or more circuits formed over the substrate 1130 may be provided outside the substrate 1130, and be attached externally. The image signal processing circuit 1126 operates at a clock frequency of 5 MHz or more. The CPU 1127 operates at a clock frequency of 20 MHz or more. The color palette memory 1111 for storing color data supplied to the driver circuit 1129, and the video memory 1112 for storing image data displayed on the display means 1128 each reads out data at a cycle of 200 nsec or less. The work memory 1113 and the program memory 1114 for storing program data and image data each reads out data at a cycle of 50 nsec or less.

Description is made now on the operation of a semiconductor device having the aforementioned configuration. First, when the semiconductor device is turned ON, the scan chain controller 1124 reads out data of an address of a defective memory cell from the ROM 1115, which is subsequently transmitted to the scan chains 1121 to 1123. The data transmitted to the scan chains 1121 to 1123 is written to the rectifier means 1116. Based on the data, the rectifier means 1116 rectifies the defective memory cell by using a redundant memory cell in the color palette memory 1111, the video memory 1112, the work memory 1113 and the program memory 1114. This embodiment can be appropriately implemented in combination with the aforementioned embodiment modes.

[Embodiment 2]

The invention can be applied to various electronic appliances, for example such as a TV set, a digital camera, a digital video camera, a portable phone, a portable information terminal, a portable game machine, a monitor, a laptop personal computer, an audio reproducing device such as a car stereo system, and an image reproducing device provided with a recording medium such as a home game machine. Specific examples of these electronic appliances are described with reference to FIGS. 6A to 6F.

Figure 6A:
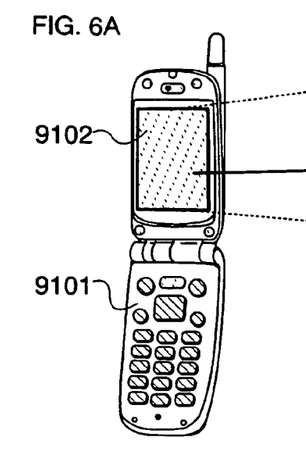
FIGS. 6A to 6F are diagrams illustrating a semiconductor device in accordance with the invention (Embodiment 2).

FIG. 6A is a portable information terminal which includes a main body 9101, a display portion 9102, and the like. FIG. 6C is a bath TV set which includes a main body 9301, a display portion 9302 and the like. FIG. 6D is a portable information terminal which includes a main body 9201, a display portion 9202 and the like. FIG. 6E is a digital video camera which includes display portions 9701, 9702 and the like.

Figure 6B:
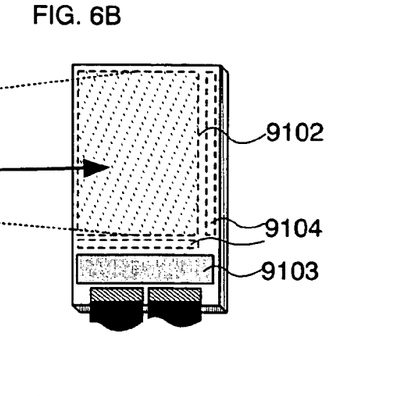
Figure 6C:
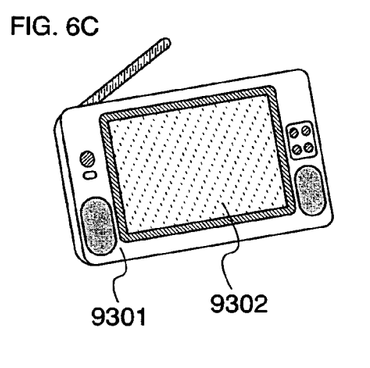
Figure 6D:
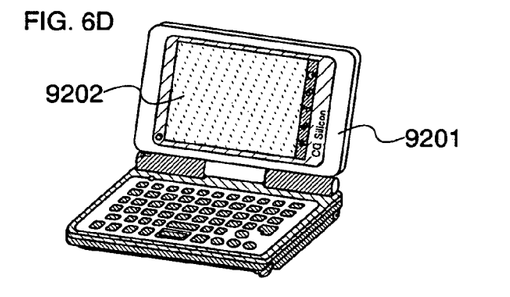
Figure 6E:
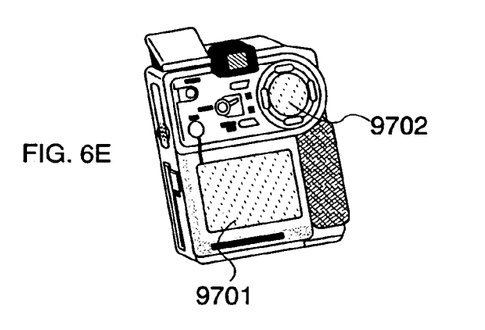

A panel including a display portion is provided with a driver circuit 9104 and a functional circuit 9103 such as a CPU and a memory means as shown in FIG. 6B. The invention can be applied to the configuration of the memory means in functional circuit 9103. An electronic appliances with a panel integrating the functional circuit 9103 as well as the driver circuit 9104 can have a smaller number of external ICs to be connected, therefore, compactness, light weight and thinness can be realized. In addition, when self-luminous light emitting elements are used as the display elements for constructing the display portion, no back light is required, therefore, thinness, compactness and light weight can be promoted as compared to the case of using liquid crystal elements.

Figure 6F:
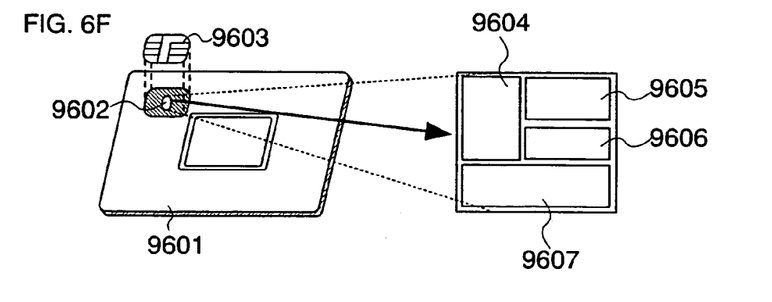

FIG. 6F is a contact IC card which includes a main body 9601, an IC chip 9602 and a module terminal 9603. The IC chip 9602 includes a RAM 9604, a ROM 9605, a CPU 9606, a RAM 9607 and the like. The invention can be applied to the configuration of the IC chip 9602.

What is claimed is:

1. A semiconductor device comprising:
   first memory means including a memory cell and a redundant memory cell;
   second memory means for storing an address of a defective memory cell;
   rectifier means including replacement means operationally connected to the first memory means;
   at least first and second scan chains for writing and storing data of the second memory means; and
   a scan chain controller operationally connected to the second memory means,
   wherein each of the scan chains is operationally connected to the scan chain controller, and
   wherein the rectifier means is operationally connected to each of the scan chains.

2. The semiconductor device according to claim 1, wherein the first memory means, the rectifier means, the scan chain controller and the scan chains are formed over the same substrate.

3. The semiconductor device according to claim 1, wherein the first memory means is an SRAM or a DRAM.

4. The semiconductor device according to claim 1, wherein the second memory means is an EPROM, an EEPROM, a flash memory, a mask ROM or a PROM.

5. A semiconductor device comprising:
   a plurality of first memory means each including a plurality of memory cells;
   second memory means for storing an address of a defective memory cell;
   a plurality of rectifier means each operationally connected to the first memory means respectively;
   at least first and second scan chains for writing and storing data of the second memory means; and
   a scan chain controller operationally connected to the second memory means,
   wherein at least one of the scan chains is incorporated in a circuit operationally connected to at least one of the plurality of first memory means,
   wherein each of the scan chains is operationally connected to the scan chain controller, and
   wherein the rectifier means is operationally connected to each of the scan chains.

6. The semiconductor device according to claim 5, wherein the first memory means, the rectifier means, the scan chain controller and the scan chains are formed over the same substrate.

7. The semiconductor device according to claim 5, wherein the first memory means is an SRAM or a DRAM.

8. The semiconductor device according to claim 5, wherein the second memory means is an EPROM, an EEPROM, a flash memory, a mask ROM or a PROM.

* * * * *